(12) United States Patent
Guo et al.

(10) Patent No.: US 11,545,290 B2
(45) Date of Patent: Jan. 3, 2023

(54) MAGNETORESISTIVE ELEMENT HAVING A GIANT INTERFACIAL PERPENDICULAR MAGNETIC ANISOTROPY

(71) Applicants: Yimin Guo, San Jose, CA (US); Rongfu Xiao, Dublin, CA (US); Jun Chen, Fremont, CA (US)

(72) Inventors: Yimin Guo, San Jose, CA (US); Rongfu Xiao, Dublin, CA (US); Jun Chen, Fremont, CA (US)

( * ) Notice: Subject to any disclaimer, the term of this patent is extended or adjusted under 35 U.S.C. 154(b) by 231 days.

(21) Appl. No.: 17/096,554

(22) Filed: Nov. 12, 2020

(65) Prior Publication Data
US 2022/0148785 A1  May 12, 2022

(51) Int. Cl.
*G11C 11/16* (2006.01)
*H01F 10/32* (2006.01)
*H01L 43/10* (2006.01)
*H01L 43/02* (2006.01)
*H01L 43/08* (2006.01)

(52) U.S. Cl.
CPC ........ *H01F 10/3286* (2013.01); *G11C 11/161* (2013.01); *G11C 11/1659* (2013.01); *G11C 11/1675* (2013.01); *H01L 43/02* (2013.01); *H01L 43/08* (2013.01); *H01L 43/10* (2013.01)

(58) Field of Classification Search
CPC ......... H01L 43/02; H01L 43/08; H01L 43/10; G11C 11/161; G11C 11/1659; G11C 11/1675; H01F 10/3286
USPC ....................................................... 257/421
See application file for complete search history.

(56) References Cited

U.S. PATENT DOCUMENTS

| 2007/0281185 | A1 | 12/2007 | Sakurai et al. | |
| 2009/0080239 | A1 | 3/2009 | Nagase et al. | |
| 2011/0034339 | A1* | 2/2011 | Goyal | C25D 11/045 977/762 |
| 2014/0175428 | A1* | 6/2014 | Guo | H01L 43/10 257/43 |
| 2014/0198564 | A1 | 7/2014 | Guo | |
| 2014/0210025 | A1* | 7/2014 | Guo | G11C 11/1675 257/421 |
| 2014/0217526 | A1 | 8/2014 | Guo | |
| 2014/0342236 | A1* | 11/2014 | Goyal | B81C 1/00031 429/209 |
| 2018/0090676 | A1* | 3/2018 | Sasaki | H01L 43/10 |
| 2022/0165470 | A1* | 5/2022 | Guo | H01F 10/3254 |

(Continued)

FOREIGN PATENT DOCUMENTS

WO  WO-2016158867 A1 * 10/2016  ............... G11B 5/39
WO  WO-2017208880 A1 * 12/2017  ............. G11C 11/16

OTHER PUBLICATIONS

H. Yang, S-H Yang S. Parkin, "The role of Mg interface layer in MgO magnetic tunnel junctions with CoFe and CoFeB electrodes", AIP Advances 2, 012150 (2012).

(Continued)

*Primary Examiner* — Jami Valentine Miller

(57) ABSTRACT

A magnetoresistive element comprises a novel iPMA cap layer on a surface of a ferromagnetic recording layer. The iPMA cap layer introduces giant interfacial magnetic anisotropy energies (G-iMAE) on the interface between the recording layer and the iPMA cap layer, yielding a giant interfacial perpendicular magnetic anisotropy (G-iPMA) of the recording layer.

20 Claims, 5 Drawing Sheets

(56) References Cited

U.S. PATENT DOCUMENTS

2022/0238799 A1* 7/2022 Guo ................... H01L 43/12

OTHER PUBLICATIONS

S. Ikeda, et al., "A perpendicular-anisotropy CoFeB—MgO magnetic tunnel junction", Nature Materials, vol. 9, p. 721-724, Sep. 2010.
S. S. P. Parkin, et al. "Giant tunnelling magnetoresistance at room temperature with MgO (100) tunnel barriers". Nature. Mater. 3 (12): 862-7 (2004).
S. Yuasa and D. Djayaprawira, "Giant tunnel magnetoresistance in magnetic tunnel junctions with a crystalline MgO(001) barrier", J. Phys. D: Appl. Phys. 40 (2007) R337-354.

* cited by examiner

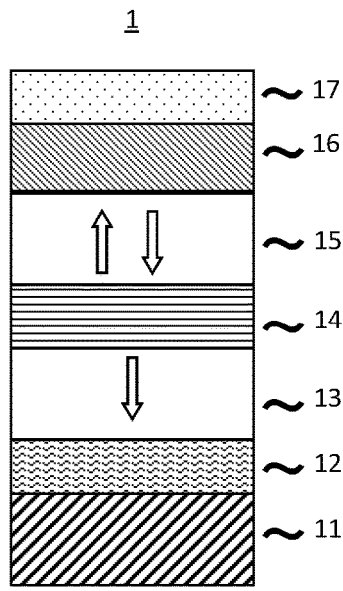
FIG. 1 (original)
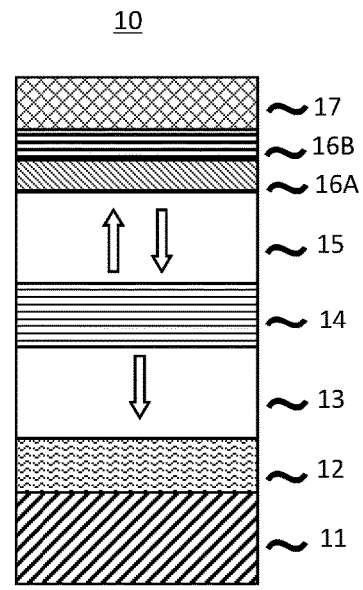
FIG. 2 (original)
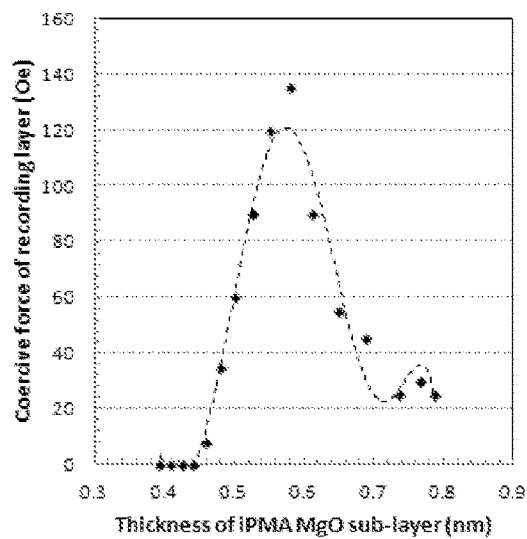
FIG. 3A (original)

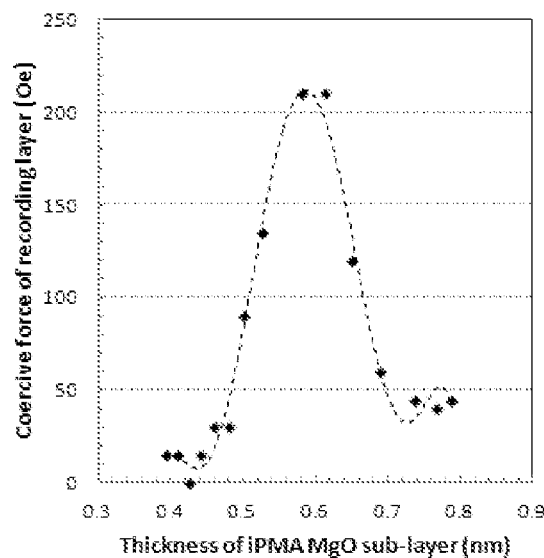
FIG. 3B (original)
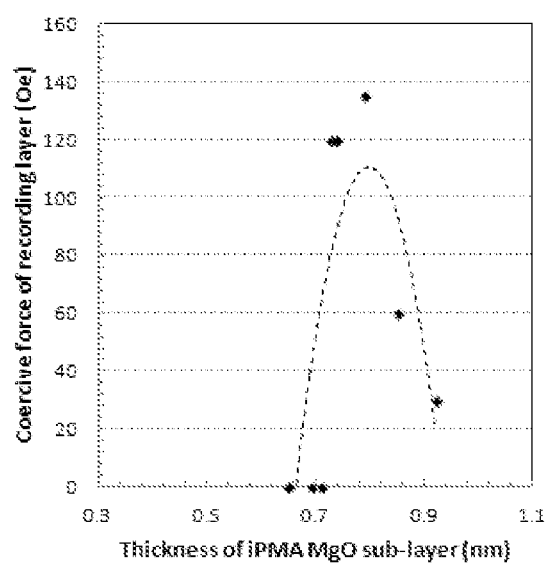
FIG. 3C (original)

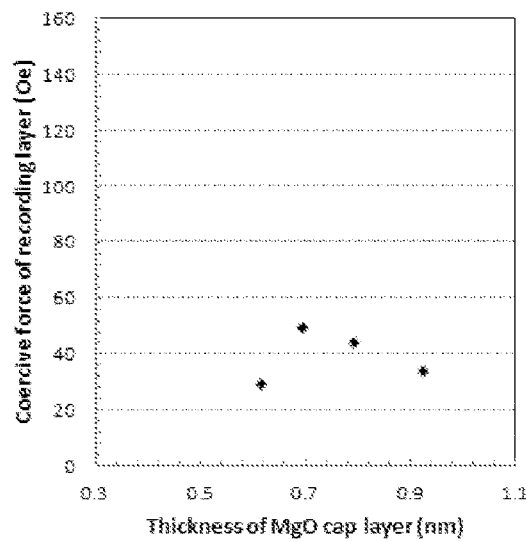
FIG. 4 (original)
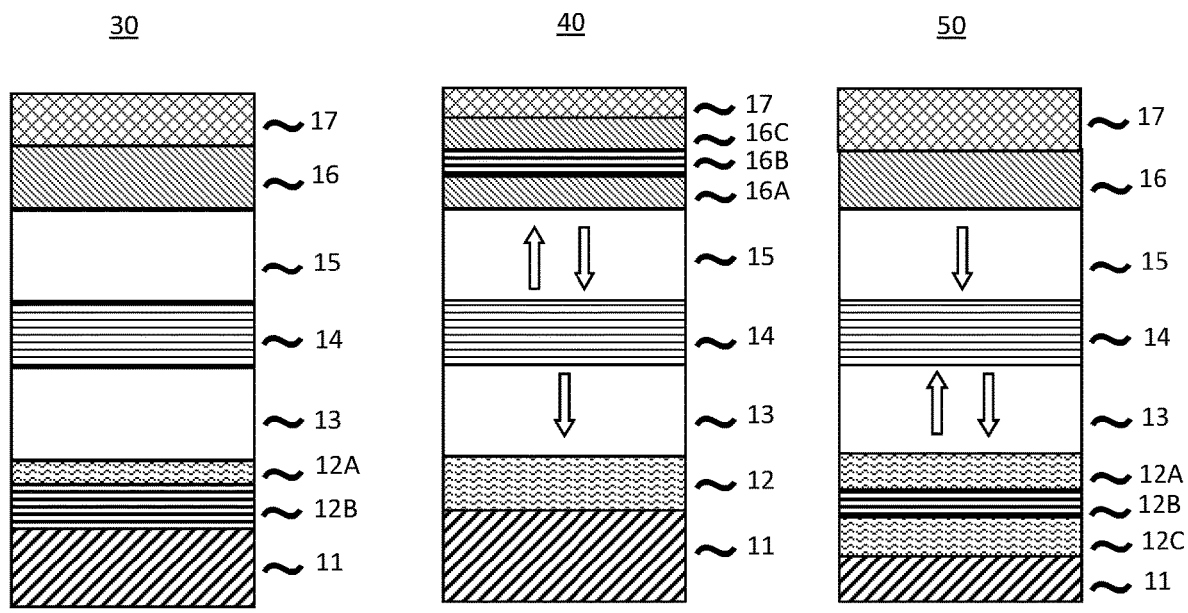
FIG. 5 (original)　　　FIG. 6 (original)　　　FIG. 7 (original)

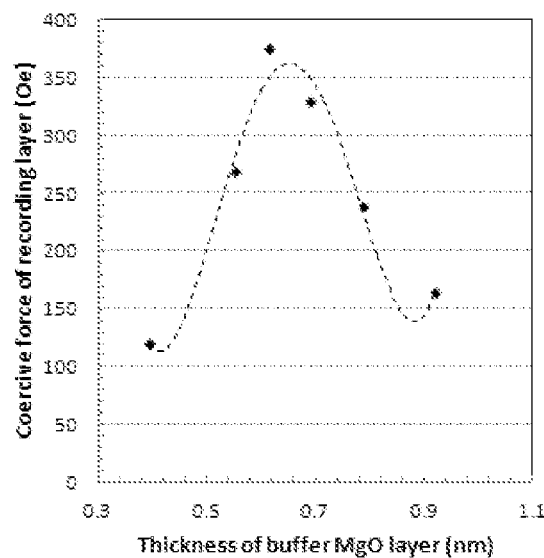
FIG. 8 (original)
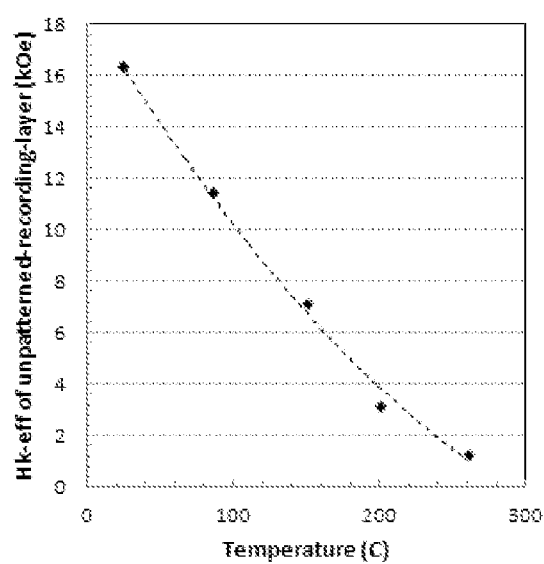
FIG. 9 (original)

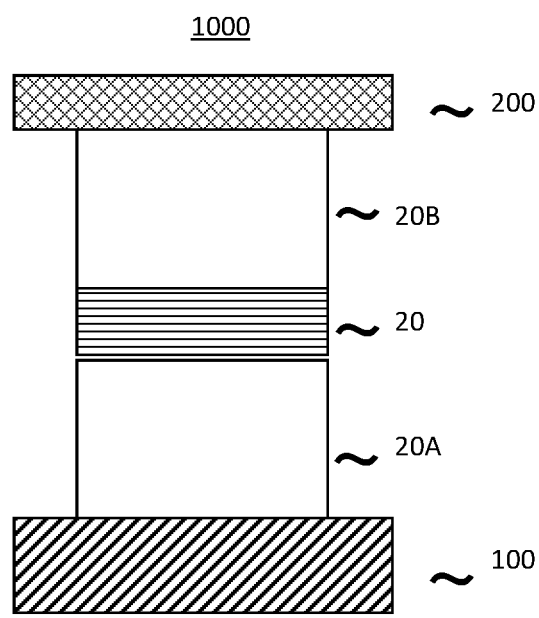
FIG. 10 (original)

MAGNETORESISTIVE ELEMENT HAVING A GIANT INTERFACIAL PERPENDICULAR MAGNETIC ANISOTROPY

BACKGROUND OF THE INVENTION

1. Field of the Invention

This invention relates to the field of magnetoresistive elements. More specifically, the invention comprises spin-transfer-torque magnetic-random-access memory (MRAM) using magnetoresistive elements having high values of interfacial perpendicular magnetic anisotropy (iPMA) as basic memory cells which potentially replace the conventional semiconductor memory used in electronic chips, especially mobile chips for power saving and non-volatility as well as memory blocks in processor-in-memory (PIM).

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed reference layer that is located on the opposite side from the recording layer and maintains a predetermined magnetization direction.

As a write method to be used in such magnetoresistive elements, there has been suggested a write method (spin torque transfer switching technique) using spin momentum transfers. According to this method, the magnetization direction of a recording layer is reversed by applying a spin-polarized current along a specific direction to the magnetoresistive element. Furthermore, as the volume of the magnetic layer forming the recording layer is smaller, the injected spin-polarized current to write or switch can be also smaller. Accordingly, this method is expected to be a write method that can achieve both device miniaturization and lower currents.

Further, as in a so-called perpendicular MTJ element, both two magnetization films have easy axis of magnetization in a direction perpendicular to the film plane due to their strong perpendicular magnetic anisotropy induced by both interface interaction and crystalline structure (shape anisotropies are not used), and accordingly, the device shape can be made smaller than that of an in-plane magnetization type. Also, variance in the easy axis of magnetization can be made smaller. Accordingly, by using a material having a large perpendicular magnetic anisotropy, both miniaturization and lower currents can be expected to be achieved while a thermal disturbance resistance is maintained.

There has been a known technique for achieving a high MR ratio in a perpendicular MTJ element by forming an underneath MgO tunnel barrier layer and an MgO cap layer that sandwich a magnetic recording layer having a pair of amorphous CoFeB ferromagnetic layers and a Boron-absorbing layer positioned between them, and accelerate crystallization of the amorphous ferromagnetic film to match interfacial grain structure to both MgO tunnel barrier layer and MgO cap layer through a thermal annealing process. An MgO layer has a rocksalt crystalline structure in which each of Mg and O atoms forms a separate face-centered cubic (FCC) lattice, and Mg and O atoms together form a simple cubic lattice. The Boron-absorbing layer is typically made of Mo or W material. The recording layer crystallization starts from both the tunnel barrier layer side and the cap layer side to its center and forms a CoFe grain structure, which is mainly a body-centered cubic (bcc) crystalline structure, having a volume perpendicular magnetic anisotropy (vPMA), as Boron atoms migrate into the Boron-absorbing layer. In the same time, a typical rocksalt-MgO (100)/bcc-CoFe(100) texture occurs at the interface of a CoFeB layer and an MgO layer, which generates an interfacial perpendicular anisotropy (iPMA). Accordingly, a coherent perpendicular magnetic tunneling junction structure is formed. By using this technique, both a high MR ratio and a high perpendicular magnetic anisotropy can be achieved.

However, when an MTJ CD size is reduced to meet needs of very advanced and small technology nodes, the MgO tunnel barrier layer needs to be thinner or contains a reduced oxygen percentage to keep a reasonable MTJ resistance and the perpendicular magnetic anisotropy in the recording layer needs to be higher to maintain a reasonable thermal stability factor ($E/k_BT$, where E denotes the energy barrier between the two stable magnetization configurations of the recording layer, $k_B$ is the Boltzmann constant, and T is the absolute temperature 300 K) which is normally required to be larger than 70. Consequentially, it becomes more difficult to achieve both a high perpendicular magnetic anisotropy in the recording layer and a high MR ratio in an MTJ element in order to maintain a good thermal stability and read/write performance.

A thick Boron-absorbing layer may help improve the volume perpendicular magnetic anisotropy (vPMA) in the recording layer. But, the damping constant of the recording layer may also increase from the material diffusion of the thick Boron-absorbing layer during the heat treatment in the device manufacturing process, which may also cause a degradation of the MR ratio. In a spin-injection MRAM, the minimum write current is proportional to the damping constant and inversely proportional to its spin polarization. Since the sum of vPMA and iPMA leads to a total value of the perpendicular magnetic anisotropy, which determines the thermal stability of the recording layer, another approach to increase the perpendicular magnetic anisotropy is to employ an in-situ plasma treatment or sputter-etching process on the top surface of the recording layer before the deposition of the MgO cap layer. However, this approach has a drawback: applying excess surface treatment on the recording layer would cause an additional property variation of the recording layer, such as its magnetic moment variation, MR ratio variation and a high wafer non-uniformity. Therefore, it is desired to develop new technologies to greatly enhance interfacial perpendicular magnetic anisotropy while keeping a high MR ratio and good/uniform properties.

SUMMARY OF THE PRESENT INVENTION

The present invention comprises perpendicular magnetoresistive elements and methods of manufacturing such perpendicular magnetoresistive elements for perpendicular spin-transfer-torque MRAM devices.

The perpendicular magnetoresistive element in the invention is sandwiched between an upper electrode and a lower electrode of each MRAM memory cell, which also comprises a write circuit which bi-directionally supplies a spin polarized current to the magnetoresistive element and a select transistor electrically connected between the magnetoresistive element and the write circuit.

The perpendicular magnetoresistive element comprises: a reference layer having a magnetic anisotropy in a direction perpendicular to a film surface and having an invariable magnetization direction; a tunnel barrier layer on the reference layer; a recording layer having magnetic anisotropy in a direction perpendicular to a film surface and having a variable magnetization direction on the tunnel barrier layer; an iPMA cap layer on a surface of the recording layer. The iPMA cap layer comprises one iPMA contacting sub-layer (iPMA-cSL) and one iPMA metal sub-layer (iPMA-mSL) on a surface of the iPMA-cSL, wherein the iPMA-mSL comprises a close-packed crystal structure: a face-centered cubic (FCC) crystal structure having a (111) plane parallel to the film surface or a hexagonal closest packed (HCP) crystal structure having a (0001) plane parallel to the film surface, and the iPMA-cSL has a critical thickness and comprises a rocksalt or a simple crystal structure having a (111) plane parallel to the film surface which has a good lattice constant matching with the close-packed plane of the iPMA-mSL. The iPMA cap layer introduces giant interfacial magnetic anisotropy energies (G-iMAE) on the top surface of the recording layer after thermal annealing, giving rise to a giant interfacial perpendicular magnetic anisotropy (G-iPMA) of the recording layer due to the special rocksalt-oxide (111)/bcc-CoFe (110) texture. The critical thickness of the iPMA-cSL for achieving G-iPMA is in a small range about 3 or 4 atomic layer thick, depending on its adjacent iPMA-mSL. Here and thereafter throughout this application, each element written in the left side of "/" is stacked above an element written in the right side thereof.

Typically as an amorphous ferromagnetic material, a CoFeB layer sandwiched by a thick MgO layer (about 1.0 nm or more) and a Boron-absorbing layer, is thermally annealed, a crystallization process occurs to form MgO (100) and further to form body-centered cubic (bcc) CoFe grains having an epitaxial growth with (100) plane parallel to the film surface of the MgO layer to form both a volume perpendicular magnetic anisotropy as Boron elements migrate into the adjacent Boron-absorbing layer, and an interfacial perpendicular magnetic anisotropy as an MgO (100)/bcc-CoFe (100) texture occurs at the interface of the CoFeB layer and the MgO layer. In more detail, there is a 45° rotational epitaxy between the crystallized bcc CoFe (100) and the rocksalt (100)-textured MgO layers. It was reported (see Article: Extended Abstracts of the 2007 International Conference on Solid State Devices and Materials, paper C-5-2 by K. Tsunekawa, etc.) that the epitaxial relationship of MgO (100)/bcc-CoFe (100) originates that CoFe crystallizes out from the interface with the (100)-textured MgO layer by solid-state nucleation and grain growth during high-temperature annealing.

In this invention, as an example, when the recording layer is a tri-layer structure of the second CoFeB sub-layer/Boron-absorbing sub-layer/the first CoFeB sub-layer, the iPMA-cSL is made of a thin MgO film having a certain thickness range, the iPMA-mSL. is made of a Ru film, a G-iMAE can been achieved after thermal annealing, giving a rise to a G-iPMA of the recording layer. The iPMA Ru sub-layer having a HCP (0001) texture induces a rocksalt-MgO (111) texture in the thin iPMA MgO sub-layer (iPMA-MgOSL), which further induces a rocksalt-MgO (111)/bcc-CoFe (110) texture at the interface of the second CoFeB sub-layer and the iPMA-MgOSL after thermal annealing and leads to a ultra-high value of iPMA, i.e., G-iPMA. The reason that an amorphous CoFeB sub-layer crystallizes into a bcc-CoFe structure with mostly (110) orientation is due to the close lattice match with the strongly textured Ru (0001)/MgO (111). However, when the thickness of the MgO sub-layer is getting larger than the critical range, it is more likely to form an MgO (100) texture near the interface between the MgO sub-layer and the second CoFeB sub-layer, and consequently the CoFeB sub-layer crystallizes into a bcc-CoFe structure with mostly (100) orientation, yielding a low iMAE. So it is important to choose an iPMA-cSL within the critical thickness range. Having a G-iPMA, the volume perpendicular magnetic anisotropy, or vPMA of the recoding layer, becomes less important. Therefore, a thinner Boron-absorbing layer can be used in a recording layer of an MTJ element having an iPMA cap layer to achieve a low damping constant and a reduced write current is also achieved.

BRIEF DESCRIPTION OF THE DRAWINGS

FIG. 1 is a cross-sectional view showing a schematic configuration of an MTJ element 1 as a prior art;

FIG. 2 is a cross-sectional view showing a schematic configuration of an MTJ element 10, according to the first embodiment;

FIG. 3A is a set of experimental data showing the coercive force of the recording layer having an iPMA cap layer structure MgO(t)/Ru (2 nm)/W (1 nm) as a function of the iPMA-MgOSL thickness, t, in the first embodiment;

FIG. 3B is a set of experimental data showing the coercive force of the recording layer having an iPMA cap layer structure MgO(t)/Ru (3 nm)/W (1 nm) as a function of the iPMA-MgOSL thickness, t, in the first embodiment;

FIG. 3C is a set of experimental data showing the coercive force of the recording layer having an iPMA cap layer structure MgO(t)/Pt (1.2 nm)/Cu (0.5 nm) as a function of the iPMA-MgOSL thickness, t, in the first embodiment;

FIG. 4 is a set of experimental data showing the coercive force of the recording layer as a function of its MgO cap layer thickness in a prior art;

FIG. 5 is a cross-sectional view showing a configuration of an MTJ element 30 as deposited, according to the second embodiment;

FIG. 6 is a cross-sectional view showing a configuration of an MTJ element 40 as deposited, according to the third embodiment;

FIG. 7 is a cross-sectional view showing a configuration of an MTJ element 50 as deposited, according to the fourth embodiment;

FIG. 8 is a set of experimental data showing the coercive force of the recording layer having an iPMA cap layer structure MgO (0.58 nm)/Ru (2 nm) and an MgO buffer layer as a function of the MgO buffer layer thickness in the third embodiment;

FIG. 9 is a set of experimental data showing measured Hk-eff as a function of environmental temperature in the un-patterned MTJ film study;

FIG. 10 is a cross-sectional view showing a configuration of a memory cell 1000 as deposited, according to the fifth embodiment.

DETAILED DESCRIPTION OF THE INVENTION

In general, according to one embodiment, there is provided a magnetoresistive element comprising:
 a reference layer having magnetic anisotropy and having an invariable magnetization direction;

a tunnel barrier layer provided on a surface of the reference layer;

a recording layer provided on a surface of the tunnel barrier layer, which is opposite to the surface of the reference layer, and having a variable magnetization direction;

an iPMA cap layer provided on a surface of the recording layer, which is opposite to the surface of the tunnel barrier layer, and having one iPMA contacting sub-layer (iPMA-cSL) on a surface of the recording layer and one iPMA metal sub-layer (iPMA-mSL) on a surface of the iPMA-cSL, wherein the iPMA-cSL comprises a rocksalt crystal structure having a critical thickness and having a (111) plane parallel to the film surface and the iPMA-mSL comprises a face-centered cubic (FCC) crystal structure having a (111) plane parallel to the film surface or a hexagonal closest packed (HCP) crystal structure having a (0001) plane parallel to the film surface, yielding a giant interfacial perpendicular magnetic anisotropy (G-iPMA) of the recording layer after thermal annealing;

an optional buffer layer provided on a surface the iPMA cap layer, which is opposite to the surface of the recording layer;

and an upper-contact multilayer provided on the most top of above said layers.

FIG. 1 is a cross-sectional view showing a configuration of an MTJ element 1 as a prior art. The MTJ element 1 is configured by stacking a bottom electrode 11, a seed layer 12, a reference layer 13, a tunnel barrier layer 14, a recording layer 15, a cap layer 16, and a protective layer 17 in this order from the bottom. The reference layer 13 and the recording layer 15 are made of ferromagnetic materials, and have uni-axial magnetic anisotropies in a direction perpendicular to the film surface. In another word, easy magnetization directions of the reference layer 13 and the recording layer 15 are perpendicular to the film surface. An easy magnetization direction is a direction in which the internal magnetic energy is at its minimum where no external magnetic field exists. Meanwhile, a hard magnetization direction is a direction which the internal energy is at its maximum where no external magnetic field exists.

The tunnel barrier layer 14 is made of a non-magnetic insulating metal oxide or nitride. The tri-layered structure (i.e., the layers 13, 14 and 15) forms a magnetic tunneling junction (MTJ). The recording layer 15 has a variable (reversible) magnetization direction. The reference layer 13 has an invariable (fixed) magnetization direction. The reference layer 13 is made of a ferromagnetic material having a perpendicular magnetic anisotropic energy which is sufficiently greater than that of the recording layer 14. This strong perpendicular magnetic anisotropy can be achieved by selecting a material, configuration and a film thickness. The perpendicular resistance of the MTJ is high when the magnetizations between the recording layer 15 and the reference layer 13 are anti-parallel; and the perpendicular resistance of the MTJ is low when the magnetizations between the recording layer 15 and the reference layer 13 are parallel. Also in this manner, a spin polarized current may only reverse the magnetization direction of the recording layer 15 while the magnetization direction of the reference layer 13 remains unchanged.

The cap layer 16 is a metal oxide layer having at least a thickness of 7.5 angstroms or a transition metal layer having a body-centered cubic (bcc) crystalline structure, such as Ta, Hf and W. The cap layer 16 serves to introduce an interfacial perpendicular magnetic anisotropy of the recording layer 15.

As an amorphous ferromagnetic material, CoFeB, in the recording layer is thermally annealed, a crystallization process occurs to form bcc CoFe grains having epitaxial growth with (100) plane parallel to surface of the tunnel barrier layer and a volume perpendicular magnetic anisotropy is induced in the recording layer, as Boron atoms migrate away toward the cap layer or any metal insertion layer in the middle of the recording layer. The (100) texture extends across the whole stack from the MgO barrier to the cap layer. Typically, the metal insertion layer serves as a good absorber for Boron atoms in the recording layer to achieve better epitaxial CoFe crystal grains.

First Embodiment of Current Invention

FIG. 2 is a cross-sectional view showing a configuration of an MTJ element 10 as deposited according to the first embodiment. The MTJ element 10 is configured by stacking a bottom electrode 11, a seed layer 12, a reference layer 13, a tunnel barrier layer 14, a recording layer 15, an iPMA cap layer comprising an iPMA-cSL 16A and an iPMA-mSL 16B, and an upper-contact layer 17 in this order from the bottom to the top.

The reference layer 13 and the recording layer 15 are made of ferromagnetic materials, and have uni-axial magnetic anisotropy in a direction perpendicular to the film surface. Further, easy magnetization directions of the reference layer 13 and the recording layer 15 are also perpendicular to the film surface. In another word, the MTJ element 1 is a perpendicular MTJ element in which magnetization directions of the reference layer 13 and the recording layer 15 are perpendicular to the film surface.

The tunnel barrier layer 14 is made of a non-magnetic insulating metal oxide or nitride. The recording layer 15 has a variable (reversible) magnetization direction. The reference layer 13 has an invariable (fixing) magnetization direction. The reference layer 13 is made of a ferromagnetic material having a perpendicular magnetic anisotropic energy which is sufficiently greater than the recording layer 14. This strong perpendicular magnetic anisotropy can be achieved by selecting a material, configuration and a film thickness. In this manner, a spin polarized current may only reverse the magnetization direction of the recording layer 15 while the magnetization direction of the reference layer 13 remains unchanged.

The iPMA cap layer consists of one iPMA-cSL 16A and one iPMA-mSL 16B, wherein the iPMA-cSL comprises a rocksalt crystal structure having a (111) plane parallel to the film surface and the iPMA-mSL 16B comprises a face-centered cubic (FCC) crystal structure having a (111) plane parallel to the film surface or a hexagonal closest packed (HCP) crystal structure having a (0001) plane parallel to the film surface, yielding a giant interfacial magnetic anisotropy of the recording layer after thermal annealing. For a different iPMA-mSL 16B, the iPMA-cSL 16A has a certain thickness range to introduce a giant iPMA of the recording layer 15. For an example, if the layer 16A is made of MgO and the layer 15B is made of Ru, the thickness of the layer 16A shall be in the range 6+/−0.5 angstroms in order to achieve a giant iPMA of the recording layer 15.

An example configuration of the MTJ element 10 will be described below. The reference layer 13 is made of CoFeB (around 1 nm)/W (around 0.2 nm)/Ru (around 0.5 nm)/Co (0.5 nm)/[Pt/Co]$_3$/Pt. The tunnel barrier layer 14 is made of MgO (around 1 nm). The recording layer 15 is made of CoFeB (around 0.6 nm)/W (0.2 nm)/CoFeB (around 1.55 nm). The layer 16A is made of MgO (around 0.6 nm). The layer 16B is made of Ru (around 2 nm). The upper-contact layer 17 is made of Ta (around 25 nm)/Ru (around 2 nm)/W (around 1 nm). The seed layer 12 is made of Ta (around 20 nm)/Ru (around 20 nm)/Ta (around 20 nm).

In the first example of un-patterned MTJ film study with an iPMA cap layer structure in which the recording layer 15 is fixed to be CoFeB (0.6 nm)/W (0.2 nm)/CoFeB (1.55 nm) and the layer 16B is fixed to be Ru (2 nm), the MgO layer 16A thickness is varied from 0.4 nm to 0.8 nm in order to evaluate its impact on coercive force (Hc) of the recording layer. As shown in FIG. 3A, the Hc of the recording layer reaches its peak value of 135 Oe when the MgO layer 16A thickness is around 0.57 nm and becomes flat around 30 Oe when the MgO layer 16A thickness is more than 0.7 nm. The measurement at an elevated temperature 150-degree C. shows this coupon film sample has an effective perpendicular magnetic anisotropy field, Hk-eff, around 7,200 Oe, which easily satisfies automobile applications. It is also found that the magnitude of Hc of the recording layer depends upon the thickness of the layer 16B. As shown in FIG. 3B, in the second example, the Hc of the recording layer reaches its peak value of 210 Oe as the thickness of the layer 16B is 3 nm. By further engineering the iPMA cap layer, the coercive force of a un-patterned recording layer can readily reach more than 350 Oe.

In the third example of un-patterned MTJ film study having an iPMA cap layer in which the recording layer 15 is fixed to be the same as previous two examples, i.e., CoFeB (0.6 nm)/W (0.2 nm)/CoFeB (1.55 nm) and the layer 16B is fixed to be Cu (0.5 nm)/Pt (1.2 nm), the MgO layer 16A thickness is varied from 0.4 nm to 1.0 nm in order to evaluate its impact on coercive force (Hc) of the recording layer. As shown in FIG. 3C, the Hc of the recording layer reaches its peak value of 130 Oe when the MgO layer 16A thickness is around 0.75 nm and quickly drops to 30 Oe when the MgO layer 16A thickness is more than 0.9 nm. It is noted that the optimum thickness of MgO layer 16A in this case is different from those in the first and second examples.

In the above examples of un-patterned MTJ film studies with various iPMA cap layer structures, the Hc behavior of the recording layer is related to the crystalline structure of the iPMA cap layer, i.e., FCC (111)/rocksalt-MgO (111) or HCP (0001)/rocksalt-MgO (111) texture. Further, the whole texture structure from the iPMA cap layer to the MgO tunnel barrier layer is {HCP (0001) or FCC (111)}/rocksalt-MgO (111)/bcc-CoFe(110)/W/bcc-CoFe(100)/rocksalt-MgO (100), which provides both a high MR-ratio and a giant perpendicular magnetic anisotropy.

For the prior art as shown in FIG. 1, the protective layer is fixed as Ta (25 nm)/Ru (2 nm)/W (1 nm)/Fe(0.3) and the thickness of the MgO cap layer is varied in order to study the PMA of the recording layer, CoFeB (0.6 nm)/W (0.2 nm)/CoFeB (1.55 nm). As shown in FIG. 4, it is found that the Hc of the recording layer remains low (around 40 Oe) in most of the thickness range of the MgO cap layer. It is believed that, in the prior art, the protective layer having a bcc phase material at its interface with its underneath MgO cap layer would help the MgO cap layer form a texture of (100) which further yields a rocksalt-MgO (100)/bcc-CoFe (100) texture at the interface of the MgO cap layer and the second CoFeB sub-layer in the recording layer after thermal annealing. Being different from the present invention, the texture structure from the MgO cap layer to the MgO tunnel barrier layer in the prior art is rocksalt-MgO (100)/bcc-CoFe (100)/W/bcc-CoFe(100)/rocksalt-MgO (100). Such a rocksalt-MgO (100)/bcc-CoFe (100) texture in the prior art generates a much smaller interfacial perpendicular magnetic anisotropy of the recording layer than the rocksalt-MgO (111)/bcc-CoFe (110) texture in an MTJ element having a iPMA cap layer in the present invention. The G-iPMA may come from a larger CoFe lattice distortion caused by the rocksalt-MgO (111)/bcc-CoFe (110) texture. A structured carbon-like lattice structure such as cubic Boron nitride may have a similar effect due to its hardness and strong bonding.

Second Embodiment of Current Invention

FIG. 5 is a cross-sectional view showing an example configuration of the MTJ element 30 as deposited according to the second embodiment. As shown in FIG. 4, the reference layer 15 is made of Pt/[Co/Pt]n/Co (around 0.5 nm)/Ru (around 0.4-5 nm)/W (around 0.15 nm)/CoFeB (around 1 nm). The tunnel barrier layer 14 is made of MgO (around 1 nm). The recording layer 13 is made of CoFeB (around 1.2 nm). The iPMA-cSL 12A is made of MgO (around 0.6 nm). The iPMA-mSL 12B is made of Ru or NiFeCr (around 5 nm)/Ru (around 3 nm). The upper-contact layer 17 is made of Ta (around 10 nm)/Ir (around 1 nm). The seed layer 11 is made of Ta (around 20 nm)/Ru (around 20 nm)/Ta (around 20 nm).

The recording layer 13 has a variable (reversible) magnetization direction. The reference layer 13 has an invariable (fixed) magnetization direction. The reference layer 15 is made of a ferromagnetic material having a perpendicular magnetic anisotropic energy which is sufficiently greater than the recording layer 13. This strong perpendicular magnetic anisotropy can be achieved by selecting a material, configuration and a film thickness. In this manner, a spin polarized current may only reverse the magnetization direction of the recording layer 13 while the magnetization direction of the reference layer 15 remains unchanged. An MTJ element 10 which comprises a recording layer 13 having a variable magnetization direction and a reference layer 15 having an invariable magnetization direction for a predetermined write current can be achieved.

The iPMA cap layer consists of one iPMA-cSL 12A and one iPMA-mSL 12B, wherein the iPMA contacting layer comprises a rocksalt crystal structure having a (111) plane parallel to the film surface and the iPMA-mSL comprises a face-centered cubic (FCC) crystal structure having a (111) plane parallel to the film surface or a hexagonal closest packed (HCP) crystal structure having a (0001) plane parallel to the film surface, yielding a giant interfacial magnetic anisotropy of the recording layer after thermal annealing. For various iPMA-mSL 12B, the iPMA-cSL 12A has a certain thickness range to introduce a G-iPMA of the recording layer 13.

Third Embodiment of Current Invention

FIG. 6 is a cross-sectional view showing a configuration of an MTJ element 40 as deposited according to the third embodiment. The MTJ element 10 is configured by stacking a bottom electrode 11, a seed layer 12, a reference layer 13, a tunnel barrier layer 14, a recording layer 15, an iPMA-cSL 16A, an iPMA-mSL 16B, a buffer layer 16C and an upper-contact layer 17 in this order from the bottom.

The iPMA cap layer consists of one iPMA-cSL 16A and one iPMA-mSL 16B, wherein the iPMA-cSL comprise a rocksalt crystal structure having a (111) plane parallel to the film surface and the iPMA-mSL comprises a face-centered cubic (FCC) crystal structure having a (111) plane parallel to the film surface or a hexagonal closest packed (HCP) crystal structure having a (0001) plane parallel to the film surface, yielding a G-iPMA of the recording layer after thermal annealing. For various transition iPMA-mSL 16B, the iPMA-cSL 16A has a certain thickness range to introduce a giant iPMA of the recording layer 15. Since the upper-contact layer may affect the crystal structure of the iPMA metal layer through diffusion or crystalline phase mismatch, the buffer layer 16C is employed to separate the iPMA metal layer and the upper-contact layer. Typically, the material choice of the buffer layer 16C is an oxide or amorphous layer.

Fourth Embodiment of Current Invention

Similar to above embodiments, the same principle can be adopted in a reverse-structured magnetoresistive element. As shown in FIG. 7, the reference layer is made of Pt/[Co/Pt]n/Co (around 0.5 nm)/Ru (around 0.4-5 nm)/W (around 0.15 nm)/CoFeB (around 1 nm). The tunnel barrier layer 14 is made of MgO (around 1 nm). The recording layer 13 is made of CoFeB (around 1.2 nm). The first iPMA-cSL 12A is made of MgO (around 0.6 nm). The iPMA-mSL 12B is made of Ru or NiFe(around 5 nm)/Ru (around 3 nm). The buffer layer 12C is made of $Al_2O_3$ or MgO (around 0.6 nm). The upper-contact layer 17 is made of Ta/Ir (around 10 nm). The seed layer 11 is made of Ta (around 20 nm)/Ru (around 20 nm)/Ta (around 20 nm).

In an example of un-patterned MTJ film study with an iPMA cap layer structure of the third embodiment in which the recording layer 15 is fixed to be CoFeB (0.6 nm)/W (0.2 nm)/CoFeB (1.55 nm), the iPMA-cSL 16A is fixed to be the previous optimized MgO (0.61 nm), the iPMA-mSL 16B is fixed to be Ru (2 nm), the buffer layer 16C is an MgO layer with a thickness varied from 0.4 nm to 0.92 nm in order to evaluate its impact on coercive force (Hc) of the recording layer. As shown in FIG. 8, the Hc of the recording layer reaches its peak value of 375 Oe when the MgO buffer layer 16C thickness is around 0.6 nm.

Fifth Embodiment of Current Invention

The temperature dependence of the effective perpendicular magnetic anisotropy field, Hk-eff, of the recording layer is very critical for an MRAM device in an automobile application. A high temperature study has been conducted on the sample having the peak Hc value in the first example of un-patterned MTJ film study, as shown in FIG. 9. It is found that the Hk-eff at room temperature is as high as 16 kOe at room temperature, and it rapidly decreases to ~3 kOe at 200 degrees Celsius. It suggests that for a pure spin-transfer current writing, it is very difficult at room temperature due to the ultra-high Hk-eff, but it becomes much easier at 200 degrees Celsius. FIG. 10 is a cross-sectional view showing a configuration of a memory cell 1000 as deposited according to the fifth embodiment. In this memory cell, the MTJ element 20 can be chosen as anyone from previous three embodiments. Both the thermal barrier layer 20B and the upper portion of the bottom electrode 20A have thermal conductivities smaller than 20 watts per meter-kelvin such that during a writing process the electrical writing current generates a heat to warm up the MTJ element to an elevated temperature in which the Hk-eff of the recording layer is greatly reduced and the writing process can be successful. Further, this structure (20A/20/20B) is sandwiched by a top electrode 100 and a bottom electrode 200. Typically, TiN has a low thermal conductivity of 11.9 watts per meter-kelvin and TiAlN (at the Al/Ti atomic ratio around 0.72) has an even lower thermal conductivity of 4.6 watts per meter-kelvin. A multilayer structure $[TiN/TiAlN]_n$ can be also designed to achieve a thermal conductivity between 3 and 5 watts per meter-kelvin. In the same time, the fixed magnetization of the reference layer should be kept stable at an elevated temperature. So it is desired that the temperature at the interface between the iPMA-cSL and the recording layer is higher than that of the reference layer by specially designing the thermal barrier layer 20B and the layer 20A with proper materials and thicknesses.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetoresistive element comprising:
   a reference layer having a magnetic anisotropy in a direction perpendicular to a film surface and having an invariable magnetization direction;
   a tunnel barrier layer provided on a surface of the reference layer;
   a recording layer provided on a surface of the tunnel barrier layer, which is opposite to a surface of the tunnel barrier layer where the reference layer is provided, and having a magnetic anisotropy in a direction perpendicular to a film surface and having a variable magnetization direction;
   an interfacial perpendicular magnetic anisotropy (iPMA) cap layer provided on a surface of the recording layer, and having one iPMA contacting sub-layer (iPMA-cSL) on a surface of the recording layer, which is opposite to the surface of the recording layer where the tunnel barrier layer is provided, and one iPMA metal sub-layer (iPMA-mSL) on a surface of the iPMA-cSL, which is opposite to the surface of the iPMA-cSL layer where the recording layer is provided, wherein the iPMA-mSL comprises a face-centered cubic (FCC) crystal structure having a (111) plane parallel to the film surface or a hexagonal closest packed (HCP) crystal structure having a (0001) plane parallel to the film surface, and the iPMA-cSL comprises a rocksalt crystal structure having a (111) plane parallel to the film surface or a crystal structure having a structured carbon-like lattice, yielding a giant interfacial perpendicular magnetic anisotropy (G-iPMA) of the recording layer after a thermal annealing;
   and an upper-contact multilayer provided on the most top of above said layers.

2. The element of claim 1, wherein the iPMA-cSL is a single oxide layer, preferred to be selected from the group of MgO, ZnO, MgZnO, ZrO, MgZrO, MgAlO, TaO, $Al_2O_3$, SiO2.

3. The element of claim 1, wherein the iPMA-cSL is a single layer, preferred to be selected from the group of Carbon, cubic Boron nitride (CBN), SiC, TaC, TiC, WC.

4. The element of claim 1, wherein the iPMA-cSL has a thickness chosen to be in the range which gives at least 75% of the peak value of the G-iPMA of the recording layer.

5. The element of claim 1, wherein the iPMA-cSL has a thickness between 5 angstroms and 7.5 angstroms.

6. The element of claim 1, wherein the iPMA-mSL is a single layer made of FCC phase or HCP phase transition metal material, preferred to be Ru, Rh, Rd, Ni, Cu, Zn, Ag, Os, Ir, Pt, Zn, Cd, or their alloy, or NiFe, NiFeCr, NiCr, NiMn, NiMnCr, IrMn, PtMn.

7. The element of claim 1, wherein the iPMA-mSL is a multilayer made of FCC phase or HCP phase transition metal material, preferred to include at least one layer in the group of Ru, Rh, Rd, Ni, Cu, Zn, Ag, Os, Ir, Pt, Zn, Cd, or their alloy, or NiFe, NiFeCr, NiCr, NiMn, NiMnCr, IrMn, PtMn.

8. The element of claim 1, wherein the iPMA-mSL has a thickness between 10 angstroms and 100 angstroms.

9. The element of claim 1 further comprising a buffer layer provided on a surface the iPMA cap layer, which is opposite to the surface of the recording layer.

10. The element of claim 9, wherein the buffer layer is a single layer of metal oxide or metal nitride, preferred to be $Al_2O_3$, MgO, MgAlO, ZnO, MgZnO, ZrO, MgZrO, MgN.

11. The element of claim 9, wherein the buffer layer comprising an amorphous material, preferred to be CoFeB, NiFeCr, NiCr.

12. The element of claim 9, wherein the buffer layer has a thickness between 3 and 10 angstroms.

13. The element of claim 1, wherein the recording layer is a single ferromagnetic Boron alloy layer, preferred to be CoFeB or CoB, FeB, the B composition percentage is between 10%-30%.

14. The element of claim 1, wherein the recording layer is a multi-layer comprising at least a ferromagnetic Boron alloy layer, preferred to be CoFeB or CoB, FeB, the Boron composition percentage is between 10%-35%.

15. The element of claim 14, wherein the recording layer has an insertion layer of transition metal material, preferred to be W, Mo, Ta, Hf, Nb, Zr, Mg.

16. The element of claim 1, wherein the thermal annealing of the magnetoresistive element is preferred to be conducted at an elevated temperature of at least 250-degree C.

17. A magnetic random memory comprises a memory cell which comprises the magnetoresistive element according to the claim 1.

18. The magnetic random memory according to the claim 17, further comprising an upper electrode and a lower electrode which sandwich the memory cell.

19. The magnetic random memory according to the claim 17, further comprising a write circuit which bi-directionally supplies a current to the magnetoresistive element.

20. The magnetic random memory according to the claim 17, wherein the memory cell comprises a select transistor electrically connected between the magnetoresistive element and the write circuit.

* * * * *